(12) United States Patent
Eckel et al.

(10) Patent No.: US 8,415,747 B2
(45) Date of Patent: Apr. 9, 2013

(54) SEMICONDUCTOR DEVICE INCLUDING DIODE

(75) Inventors: Hans-Günter Eckel, Rostock (DE); Jörg Schumann, Ribnitz (DE)

(73) Assignee: Infineon Technologies Austria AG, Villach (AT)

( * ) Notice: Subject to any disclaimer, the term of this patent is extended or adjusted under 35 U.S.C. 154(b) by 162 days.

(21) Appl. No.: 12/980,041

(22) Filed: Dec. 28, 2010

(65) Prior Publication Data

US 2012/0161224 A1  Jun. 28, 2012

(51) Int. Cl.
*H01L 29/788* (2006.01)

(52) U.S. Cl. .................................. 257/371; 257/337

(58) Field of Classification Search .......... 257/347–412, 257/E29.008
See application file for complete search history.

(56) References Cited

U.S. PATENT DOCUMENTS

| | | | | |
|---|---|---|---|---|
| 6,987,303 | B2 * | 1/2006 | Yu | 257/371 |
| 2012/0205749 | A1 * | 8/2012 | Chakravarti et al. | 257/369 |

OTHER PUBLICATIONS

Drucke, D., et al., "Power Diodes with Active Control of Emitter Efficiency." Proceedings of 2001 International Symposium on Power Semiconductor Devices & IC's, ISPSD. pp. 231-234.

Xu, Z., et al., "Experimental Demonstration of the MOS Controlled Diode (MCD)." Fifteenth Annual IEEE Applied Power Electronics Conference and Exposition, 2000. vol. 2, p. 1144-1148.

Sweet, M., et al., "Experimental Demonstration of 3.3kV Planar CIGBT in NPT Technology." Proceedings of the 20th International Symposium on Power Semiconductor Devices & IC's. 2008. pp. 48-51.

* cited by examiner

*Primary Examiner* — Cuong Q Nguyen
(74) *Attorney, Agent, or Firm* — Murphy, Bilak & Homiller, PLLC

(57) ABSTRACT

A semiconductor device includes a cathode and an anode. The anode includes a first p-type semiconductor anode region and a second p-type semiconductor anode region. The first p-type semiconductor anode region is electrically connected to an anode contact area. The second p-type semiconductor anode region is electrically coupled to the anode contact area via a switch configured to provide an electrical connection or an electrical disconnection between the second p-type anode region and the anode contact area.

25 Claims, 8 Drawing Sheets

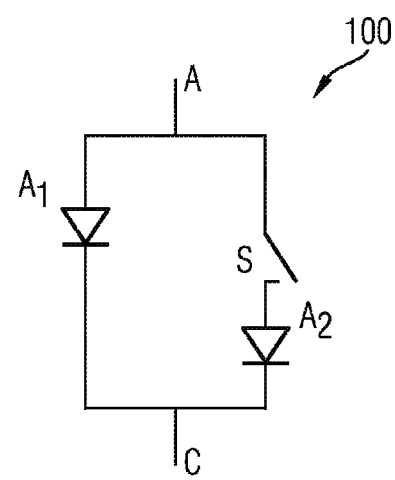
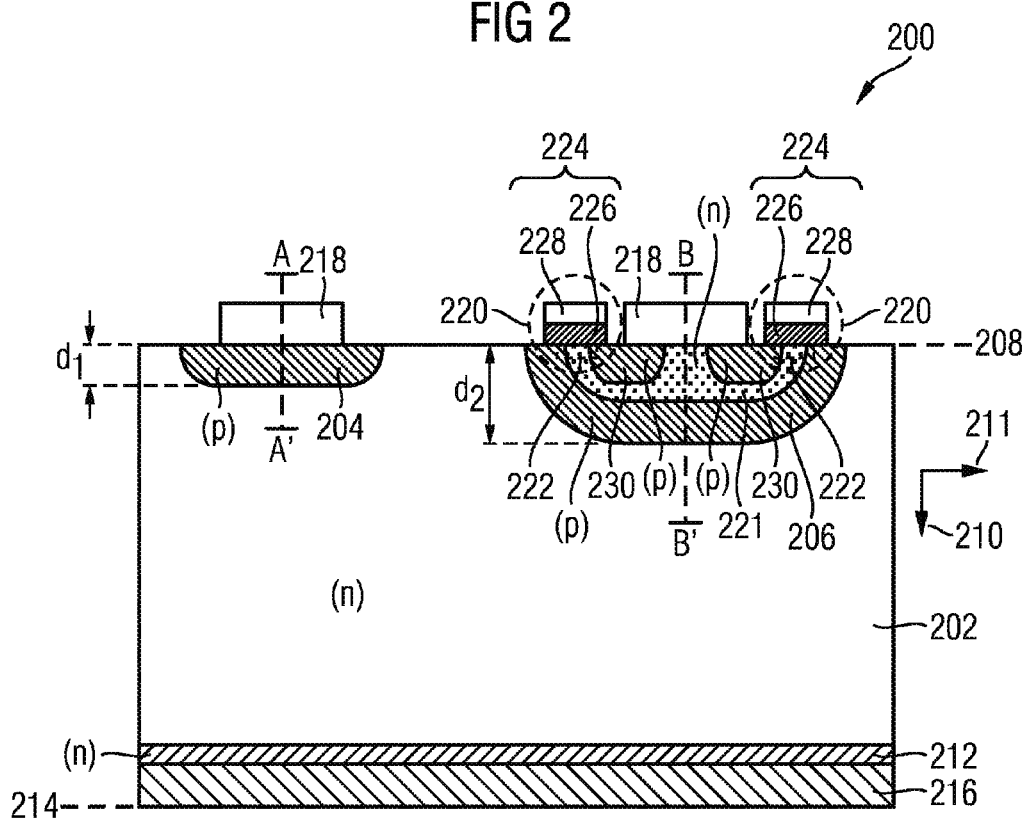

SEMICONDUCTOR DEVICE INCLUDING DIODE

BACKGROUND

Semiconductor diodes are widely used in semiconductor applications. In semiconductor converter applications the trade-off between a reverse recovery behavior and an on-state characteristic of a free wheeling diode has an influence on the converter characteristic. Therefore, it is desirable to improve the trade-off between the reverse recovery behavior and the on-state characteristics of a diode.

SUMMARY

According to an embodiment of a semiconductor device, the semiconductor device includes a cathode. The semiconductor device further includes an anode having a first p-type semiconductor anode region and a second p-type semiconductor anode region. The first p-type semiconductor anode region is electrically connected to an anode contact area. The second p-type semiconductor anode region is electrically coupled to the anode contact area via a switch configured to provide an electrical connection or an electrical disconnection between the second p-type anode region and the anode contact area.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The features of the various illustrated embodiments can be combined unless they exclude each other.

Embodiments are depicted in the drawings and are detailed in the description which follows.

FIG. 1 illustrates a schematic view of one embodiment of a diode including a first anode and a second anode, the second anode being configured to being switched on or off by a switch.

FIG. 2 illustrates a cross-section of a portion of one embodiment of a diode including a first anode and a second anode, the second anode being configured to being switched on or off by a Field Effect Transistor (FET).

DETAILED DESCRIPTION

Figure 3:
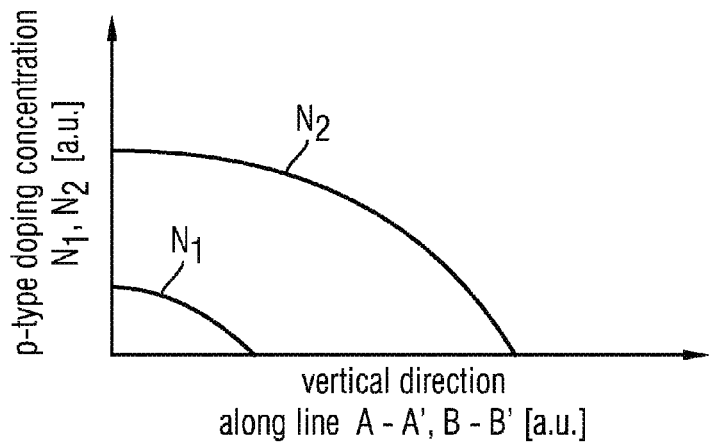
FIG. 3 is a schematic graph illustrating one embodiment of a profile of p-type doping along a line A-A' (B-B') of the first anode (second anode) illustrated in FIG. 2.

In the following Detailed Description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A number of embodiments are explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor carrier.

FIG. 1 illustrates a schematic view of one embodiment of a diode 100 including an anode A and a cathode C. The anode A includes a first anode $A_1$ and a second anode $A_2$. The first anode $A_1$ is electrically connected to an anode contact (not illustrated in FIG. 1). The second anode $A_2$ is electrically coupled to the anode contact via a switch S configured to provide an electrical connection or disconnection between the second anode $A_2$ and the anode contact.

The switch S may be any device that is suitable to switch between an on-state, i.e. a conductive state, and an off-state, i.e. a non-conductive state. As an example, the switch S may include a transistor such as an FET or a bipolar transistor.

According to one embodiment, the switch S may be at least partly formed in an active area of the diode 100. As an example, the second anode $A_2$ may include a semiconductor region common to both the diode 100 and the switch S, e.g., a p-type semiconductor region constituting the second anode and one of source and drain (emitter and collector) of an FET (bipolar transistor). According to another embodiment, the switch S may be formed in an active area different from the active area of the diode 100. As an example, the second anode $A_2$ may be electrically coupled to the switch S via contact plugs and/or a wiring and the switch S may be electrically coupled to the anode contact via other contact plugs and/or another wiring. The cathode C includes a cathode contact, e.g., a metal area, common to both the first anode $A_1$ and the second anode $A_2$.

When the switch S is in the on-state, i.e. conductive state, the second anode $A_2$ contributes to the current flow between the anode A and the cathode C. When the switch S is in the off-state, current flow between the cathode C and the second anode $A_2$ is disabled. An anode efficiency is set up higher in the second anode $A_2$ than in the first anode $A_1$ by appropriately adjusting anode parameters that have an impact on the efficiency such as dose of doping, e.g., doping concentration and vertical extension of doping or minority carrier lifetime in the anode A, for example. The diode 100 is capable of blocking voltage in the on-state and in the off-state of switch S. Whereas the diode 100 operates in a so-called high speed mode having a low charge carrier concentration and thus beneficial reverse recovery behavior when the switch S is in the off-state with the second anode $A_2$ being disabled, the diode 100 operates in a so-called low saturation mode having a high charge carrier concentration and a low on-state resistance when the switch S is in the on-state with second anode $A_2$ being enabled. Whereas the off-state of the switch S allows for a better reverse recovery characteristic of the diode 100, the on-state of the switch S allows for a better on-state characteristic of the diode 100. Thus, by switching between the on-state and the off-state of the switch S depending on the operation mode of the diode 100, the trade-off between reverse recovery behavior and on-state characteristic of the diode 100 can be improved.

FIG. 2 illustrates a cross-section of a portion of one embodiment of a diode 200. The diode 200 includes an n-type drift zone 202 such as an n-type semiconductor substrate, e.g., a Si substrate having none, one or a plurality of semiconductor layers such as epitaxial layers thereon. Within the n-type drift zone 202, a first p-type anode region 204 and a second p-type anode region 206 are formed, both regions adjoining to a first side 208 of the n-type drift zone 202. A bottom side of the second p-type anode region 206 is located deeper within the n-type drift zone 202 than the bottom side of first p-type anode region 204, i.e. an extension $d_2$ of the second p-type anode region 206 along a vertical direction 210 from the first side 208 into the n-type drift zone 202 is larger than the corresponding extension $d_1$ of the first p-type anode region 204. A lateral direction 211 is parallel to the first side 208 and perpendicular to the vertical direction 210.

An n-type cathode region 212 adjoins to the n-type drift zone 202 at a second side 214 of the n-type drift zone 202. The n-type cathode region 212 is common to the first p-type anode region 204 and to the second p-type anode region 206. A cathode contact 216 such as a metal or metal alloy adjoins the n-type cathode region 212.

The first p-type anode region 204 is electrically connected to an anode contact 218 at the first side 208. The anode contact 208 may include one or several contact plugs and/or one or several wirings.

The second p-type anode region 206 is electrically coupled to the anode contact 218 via an FET 220. The FET 220 includes the p-type anode region 206 as one of source and drain. An n-type region 221 is arranged within the p-type anode region 206 and adjoins the first side 208. A channel 222 is located at the first side 208 within the n-type region 221. A conductivity of the channel 222 is controllable by a gate structure 224 arranged above the channel 222. The gate structure 224 includes a gate dielectric 226, e.g., $SiO_2$, and a gate electrode 228, e.g., a conductive or semi-conductive material such as a metal, a metal alloy or a doped semiconductor. A p-type region 230 constituting the other one of source and drain of the FET 220 is arranged in the n-type region 221 and adjoins the first side 208. Current flow between source and drain of FET 220 is controllable along the lateral direction 211 of the first side 208 between the second p-type anode region 206 as the one of source and drain and the p-type region 230 as the other one of source and drain upon application of a respective voltage to the gate electrode 228. Thus, the reverse recovery behavior and the on-state characteristic of the diode can be influenced by switching the second p-type anode region 206 on and off via the FET 220. Thereby, the trade-off between the reverse recovery behavior and the on-state characteristic can be improved.

The doping and vertical dimensions of the first and second p-type anode regions 204, 206 may be different from the embodiment illustrated in FIG. 2. The dose of doping of the second p-type anode region 206 may be set larger than the dose of doping of the first p-type anode region 204 also by e.g., setting a depth of the first p-type anode region 204 into the n-type drift zone 202 larger than the depth of the second p-type anode region 206 associated with a respective increase of the doping concentration in the second p-type anode region 206. A ratio of dose of doping of the second p-type anode region 206 to the dose of doping of the first p-type anode region 204 may be between 5 and $10^4$, or 5 to $10^3$ or 5 to $10^2$, for example.

FIG. 3 illustrates a schematic graph of one embodiment of a profile of concentration $N_1$ ($N_2$) of p-type impurities along a line A-A' (B-B') of the first p-type anode region 204 (of the second p-type anode region 206) illustrated in FIG. 2.

The concentration $N_1$ of the p-type doping in the first p-type anode region 204 of FIG. 2 is smaller than the concentration $N_2$ of the p-type doping in the second p-type anode region 206. Thereby, the anode efficiency of the second p-type anode region 206 can be set-up larger than the anode efficiency of the first p-type anode region 204. The profiles of concentration $N_1$, $N_2$ may be adjusted by appropriately choosing implant parameters such as energy and dose, for example.

Figure 4:
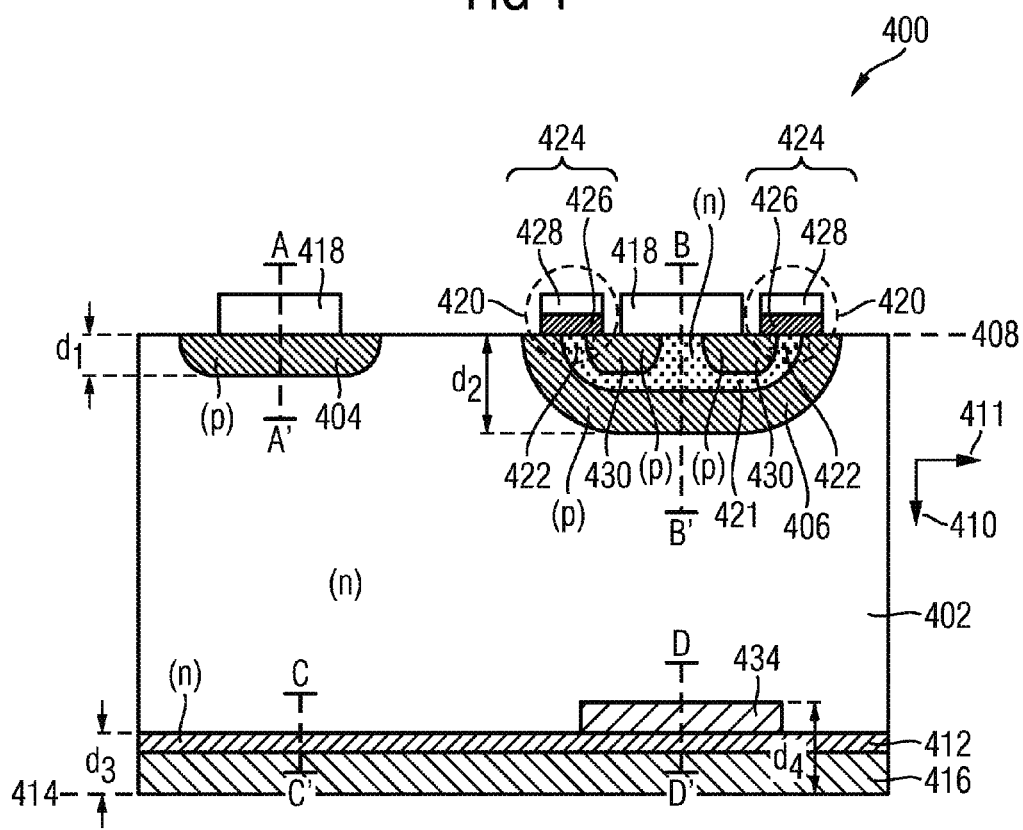
FIG. 4 illustrates a cross-section of a portion of yet another embodiment of a diode including a first anode and a second anode, the first anode being arranged opposite to a first portion of a cathode having a smaller average n-type doping concentration than a second portion of the cathode opposite to the second anode.

FIG. 4 illustrates a cross-section of a portion of yet another embodiment of a diode 400 that is similar to the diode 200 of the embodiment illustrated in FIG. 2. However, diode 400 differs from diode 200 by a second n-type cathode region 434 in addition to the n-type cathode region 412. The second n-type cathode region 434 is arranged opposite the second p-type anode region 406, but is absent in a region opposite the first p-type anode region 404. Further, the second n-type cathode region 434 extends deeper into the n-type drift zone 402 than the n-type cathode region 412, i.e. an extension $d_4$ of the second n-type cathode region 434 along the vertical direction 410 from the second side 414 into the n-type drift zone 402 is larger than the corresponding extension $d_3$ of the n-type cathode region 412. Thereby, the cathode efficiency can be set-up larger in a region opposite the second p-type anode region 406 than in a region opposite the first p-type anode region 404. As an example, $d_4$ may be adjusted to be larger than $d_3$ by appropriately choosing implant parameters such as the implant energy, for example.

Figure 5:
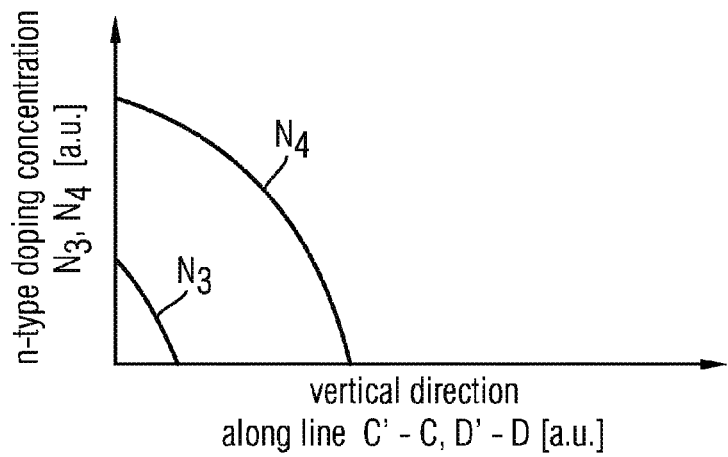
FIG. 5 is a schematic graph illustrating one embodiment of a profile of n-type doping along a line C-C' (D-D') of the first cathode portion (the second cathode portion) illustrated in FIG. 4.

FIG. 5 illustrates a schematic graph of one embodiment of a profile of concentration $N_3$ ($N_4$) of n-type impurities along a line C-C' (D-D') of the n-type cathode region 412 (of the second n-type cathode region 434) illustrated in FIG. 4.

The concentration $N_3$ of the n-type impurities in the n-type cathode region 412 of FIG. 4 is smaller than the concentration $N_4$ of the n-type impurities in the second n-type cathode region 434. Thereby, the cathode efficiency can be set-up larger in a region opposite the second p-type anode region 406 than in a region opposite the first p-type anode region 404. The profiles of concentration $N_3$, $N_4$ may be adjusted by appropriately choosing implant parameters such as energy and dose, for example.

Figure 6:
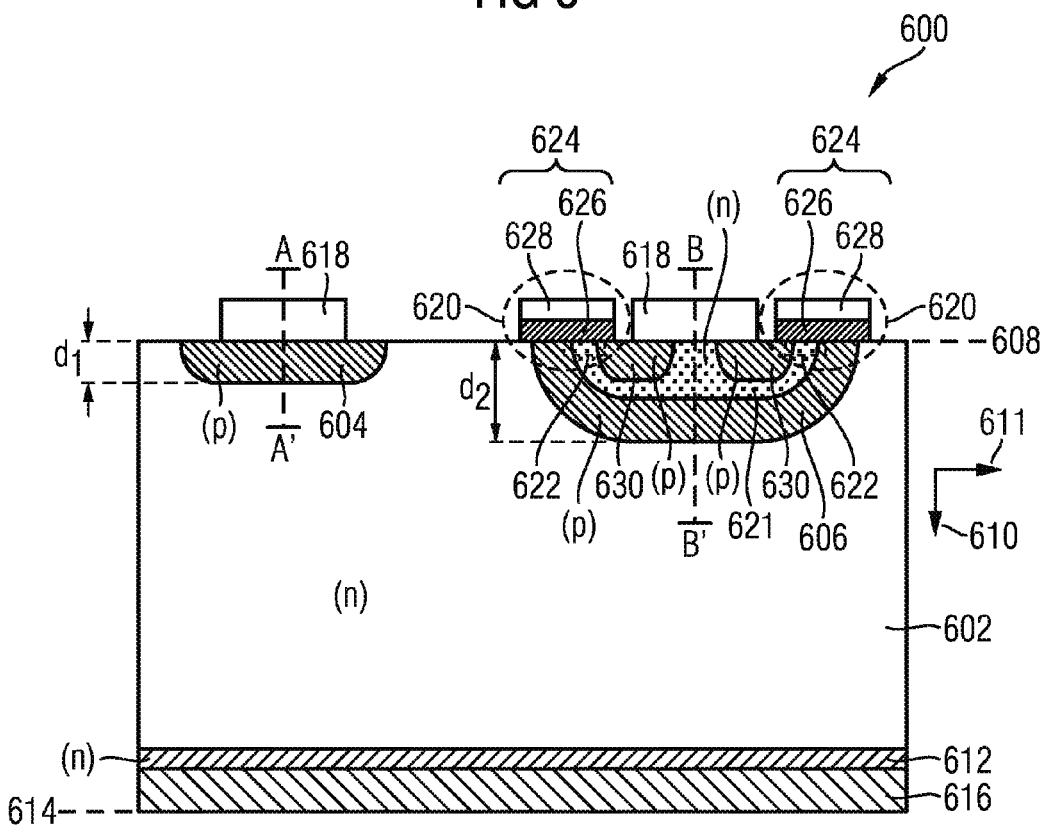
FIG. 6 illustrates a cross-section of a portion of another embodiment of a diode including a first anode and a second anode, the second anode being configured to being switched on or off by a gate of an FET extending along a channel direction into an area above an n-type drift zone.

FIG. 6 illustrates a cross-section of a portion of yet another embodiment of a diode 600 that is similar to the diode 200 of the embodiment illustrated in FIG. 2. However, diode 600 differs from diode 200 by the dimensions of the gate structure 624. Whereas one lateral extension of the gate structure 224 of diode 200 of FIG. 2 ends above the second p-type anode region 206, the corresponding lateral extension of the gate structure 624 of diode 600 of FIG. 6 ends above the n-type drift zone 602. This distinguishing feature provides the technical effect of a further reduction of the charge carrier concentration in the n-type drift zone 602 when operating the diode 600 in a single-polar mode having no voltage blocking capability. In this single-polar mode, a positive voltage is applied to the gate electrode 628 so as to allow a flow of an electron current along a channel between the n-type drift zone 602 and the n-type region 621 at the first side 608. It is thus possible to reduce the charge carrier concentration within the n-type drift zone 602 and to operate the diode 600 at a very high speed. However, before the operation continues with reverse recovery, the diode 600 has to return into an operation mode having a voltage blocking capability, e.g., by changing the voltage applied to the gate electrode 628.

Figure 7A:
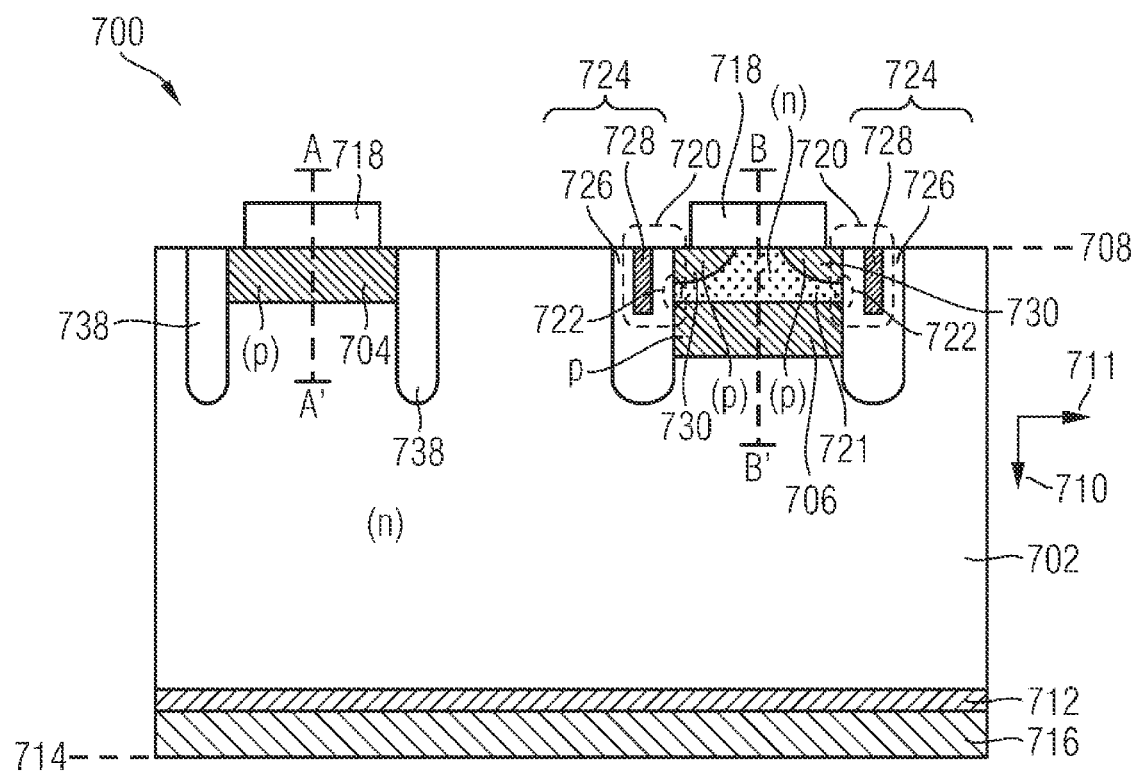
FIG. 7A illustrates a cross-section of a portion of another embodiment of a diode including a first anode adjoining to a trench isolation and a second anode, the second anode being configured to being switched on or off by a trench FET.

FIG. 7A illustrates a cross-section of a portion of another embodiment of a diode 700. The diode 700 differs from the diode 200 illustrated in FIG. 2 in that the first p-type anode region 704 laterally adjoins a trench isolation 738 extending from the first side 708 into the n-type drift zone 702 along the vertical direction 710. The trench isolation 738 may be formed by etching a trench into the n-type drift zone 702 by an etch process such as a dry etch process followed by filling the trench with an electrically insulating material such as an oxide of silicon, for example. In the embodiment of FIG. 7A, the trench isolation 738 extends deeper into the n-type drift zone 702 than the first p-type anode region 704, i.e. a bottom side of the trench isolation 738 is below the bottom side of the first p-type anode region 704. According to other embodiments a bottom side of the trench isolation 738 may also be located above or at the same level as the bottom side of the first p-type anode region 704.

The diode 700 further differs from the diode 200 illustrated in FIG. 2 in that FET 720 is a vertical channel trench FET and not a lateral channel FET such as FET 220. The gate structure 724 of the FET 720 includes a gate electrode 728 and a dielectric 726 arranged within a trench. Lateral sides of each one of the second p-type anode region 706 constituting one of source and drain, the n-type region 721 including a channel 722 and the p-type region 730 constituting the other one of source and drain adjoin to the gate structure 724. The conductivity of the channel 722 is controllable by the voltage applied to the gate electrode 728.

Figure 7B:
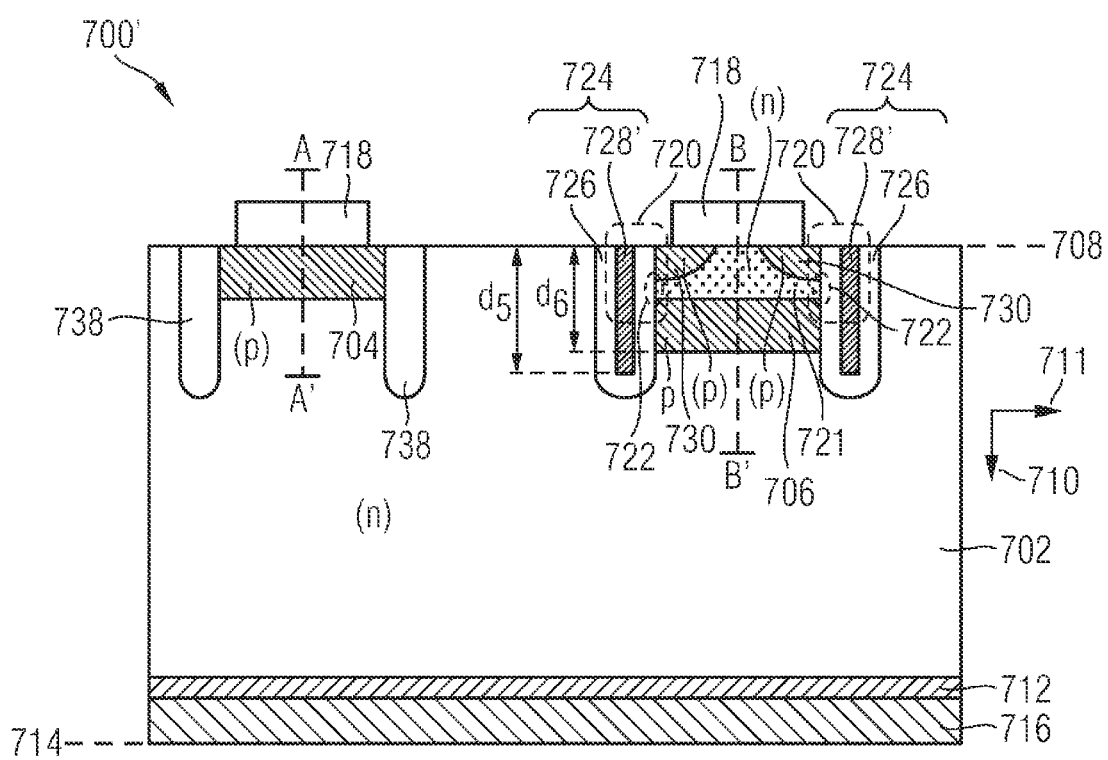
FIG. 7B illustrates a cross-section of a portion of yet another embodiment of a diode including a first anode adjoining a trench isolation and a second anode configured to being switched on or off by a trench FET, the gate electrode of the trench FET extending deeper into an n-type drift zone than the second anode.

FIG. 7B illustrates a cross-section of a portion of yet another embodiment of a diode 700' similar to the diode 700 of the embodiment illustrated in FIG. 7A.

The diode 700' of FIG. 7B differs from the diode 700 of FIG. 7A in that the gate electrode 728' extends deeper into the n-type drift zone 702 than the second p-type anode region 706, i.e., a bottom side of the gate electrode 728' is located below the bottom side of the second p-type anode region 706. In other words, a depth $d_5$ of a bottom side of the gate electrode 728' to the first side 708 is larger than the depth $d_6$ of the bottom side of the second p-type anode region 706 to the first side 708.

Similar to the gate electrode 628 of the planar FET 620 illustrated in FIG. 6, the gate electrode 728' provides the technical effect of a further reduction of the charge carrier concentration in the n-type drift zone 702 when operating the diode 700' in a single-polar mode having no voltage blocking capability. In this single-polar mode, a positive voltage is applied to the gate electrode 728' so as to allow a flow of an electron current along a vertical channel between the n-type drift zone 702 and the n-type region 721 at a sidewall of the trench. It is thus possible to reduce the charge carrier concentration within the n-type drift zone 702 and to operate the diode 700' at a very high speed. However, before the operation continues with reverse recovery, the diode 700' has to return into an operation mode having a voltage blocking capability, e.g., by changing the voltage applied to the gate electrode 728'.

Figure 8A:
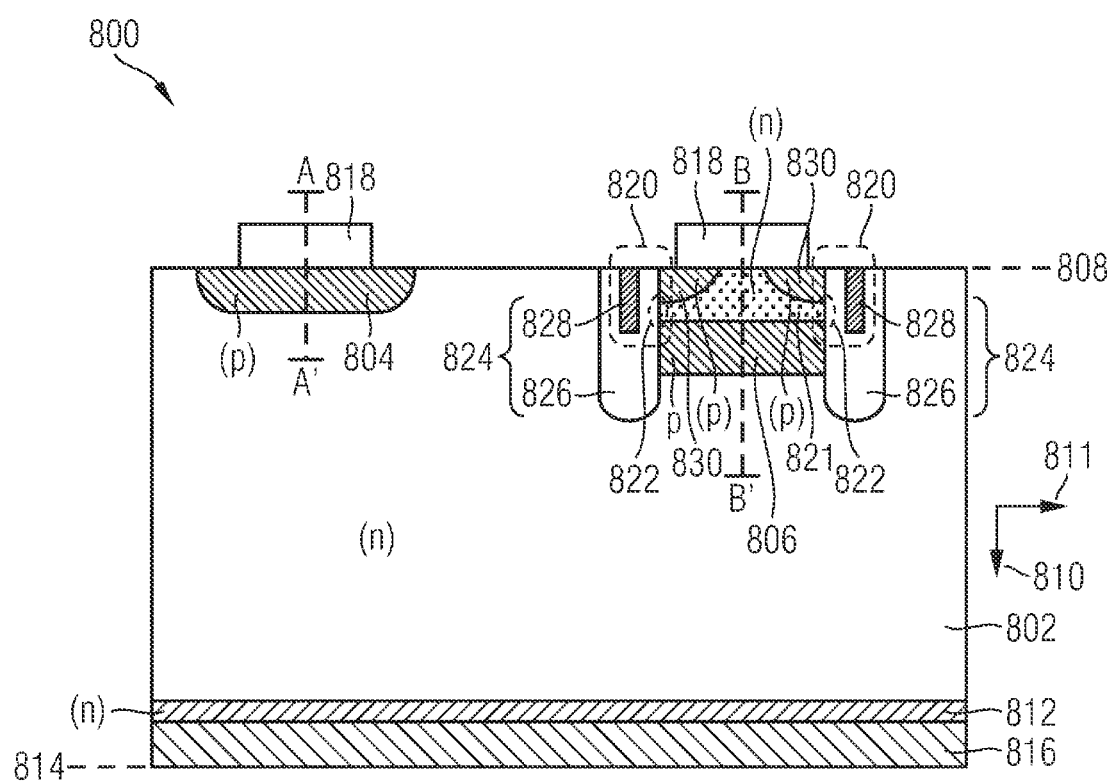
FIG. 8A illustrates a cross-section of a portion of another embodiment of a diode including a first anode and a second anode, the second anode being configured to being switched on or off by a trench FET.

FIG. 8A illustrates a cross-section of a portion of another embodiment of a diode 800 similar to the diode 700 of the embodiment illustrated in FIG. 7A.

The diode 800 differs from the diode 700 of FIG. 7A in that the diode 800 lacks any trench isolations adjoining to first p-type anode region 804. Instead, the first p-type anode region 804 is surrounded by the n-type drift zone 802 similar to the embodiments illustrated in FIGS. 2, 4 and 6.

Figure 8B:
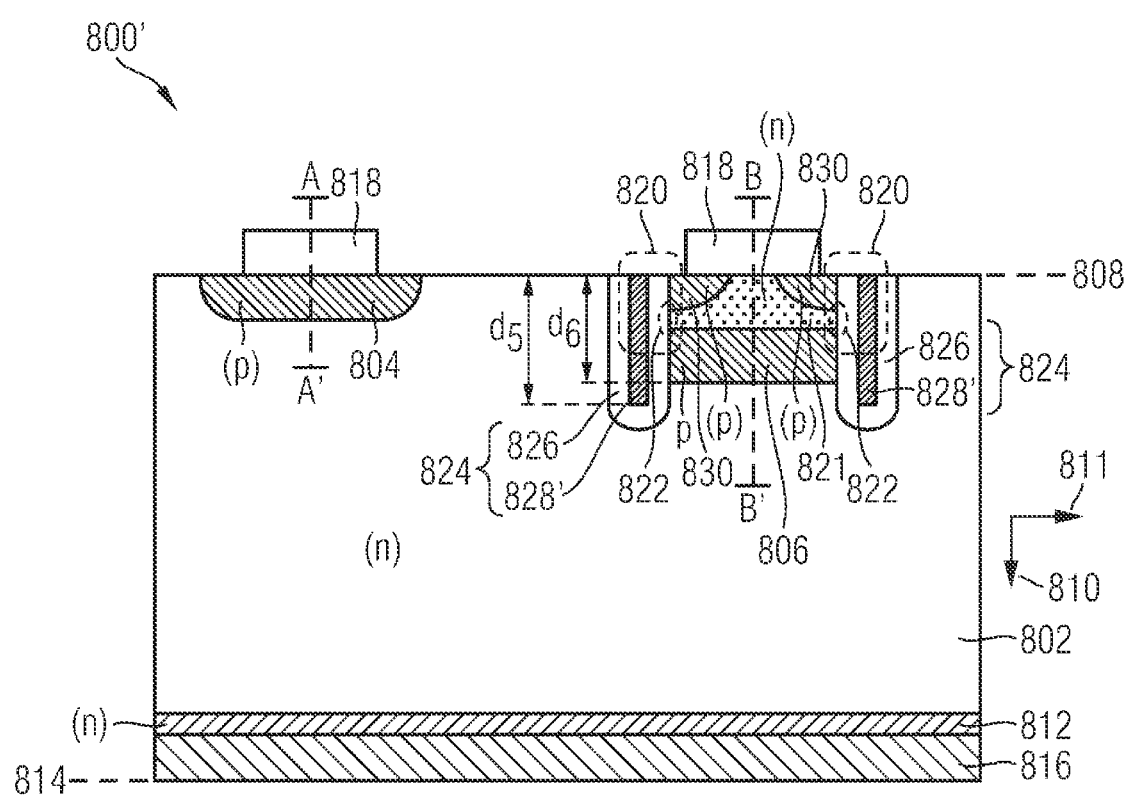
FIG. 8B illustrates a cross-section of a portion of yet another embodiment of a diode including a first anode and a second anode configured to being switched on or off by a trench FET, the gate electrode of the trench FET extending deeper into an n-type drift zone than the second anode.

FIG. 8B illustrates a cross-section of a portion of yet another embodiment of a diode 800' similar to the diode 800 of the embodiment illustrated in FIG. 8A.

The diode 800' of FIG. 8B differs from the diode 800 of FIG. 8A in that the gate electrode 828' extends deeper into the n-type drift zone 802 than the second p-type anode region 806, i.e., a bottom side of the gate electrode 828' is located below the bottom side of the second p-type anode region 806. In other words, a depth $d_5$ of a bottom side of the gate electrode 828' to the first side 808 is larger than the depth $d_6$ of the bottom side of the second p-type anode region 806 to the first side 808. With regard to the technical effect associated with the arrangement of the gate electrode 828', reference is taken to the gate electrode 728' of FIG. 7B and the related description above.

According to other embodiments, the diode may include a lateral channel FET and a first p-type anode region laterally adjoining a trench isolation.

The arrangement of a trench isolation adjacent the first p-type anode region allows to reduce the emitter efficiency of this region. When forming the switch as a trench FET, the channel conductivity may be improved.

Figure 9:
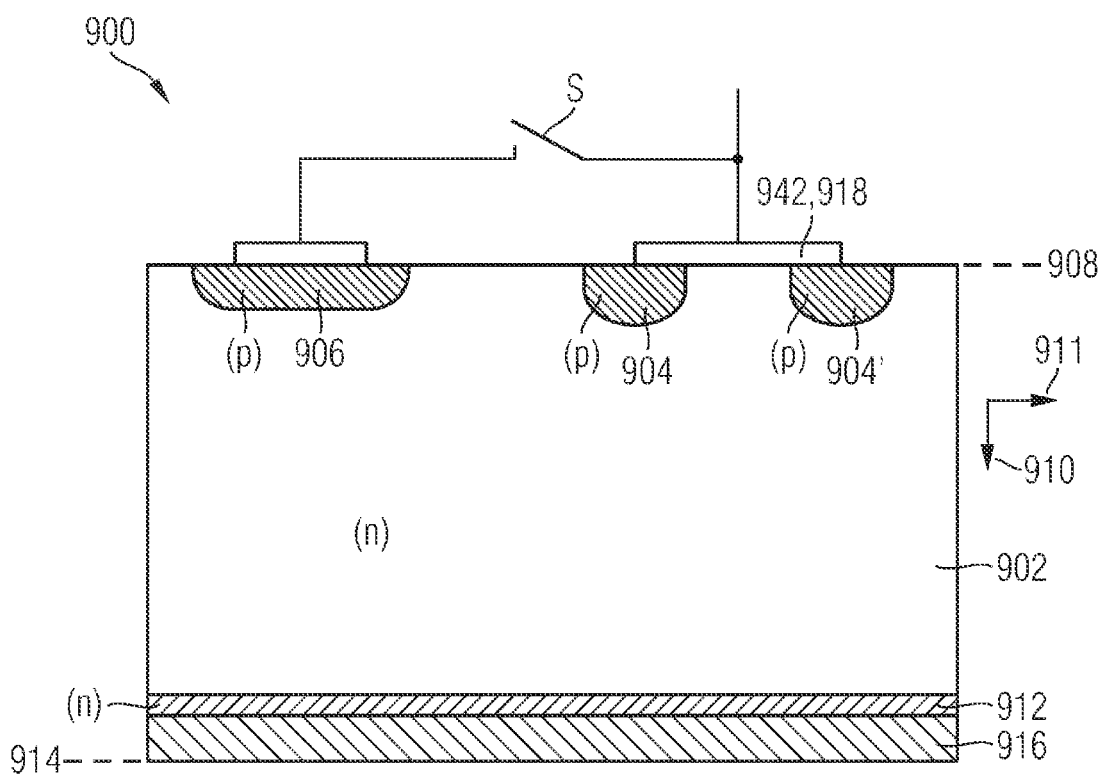
FIG. 9 illustrates a cross-section of a portion of yet another embodiment of a diode including a first anode and a second anode, the first anode being part of a merged PIN Schottky diode.

FIG. 9 illustrates a cross-section of a portion of yet another embodiment of a diode 900 including a cathode contact 916, an n-type cathode region 912, an n-type drift zone 902 and a second p-type anode region 906 similar to diodes 200, 400 and 600 of FIGS. 2, 4 and 6. The first p-type anode regions 904, 904' are part of a merged PIN Schottky diode. The merged PIN Schottky diode further includes a Schottky junction between a metal contact 942 on the first side 908 and the n-type drift zone 902 adjoining thereto. The metal contact 942 may be part of a first anode contact 918 of the diode 900 or it may be electrically connected thereto. The metal contact 942 also provides an electrical connection to the first p-type anode regions 904, 904'. Thus, in the merged PIN Schottky diode the first p-type anode regions 904, 904' and the metal contact 942 constitute the anode of this merged PIN Schottky diode.

A switch S provides an electrical connection or disconnection between the second p-type anode region 906 and the anode contact 918. According to one embodiment, the switch S may be at least partly formed in an active area of the diode 900. According to another embodiment, the switch S may be formed in an active area different from the active area of the diode 900. Unlike the second anode region 906, the anode of the merged PIN Schottky diode cannot be enabled or disabled by the switch S. Since the merged PIN Schottky diode allows to reduce the emitter efficiency, the difference in the efficiency of the diode 900 between the operation mode of opened switch S and closed switch S may be further enlarged, i.e. the difference in the charge carrier concentration between the operation mode of opened switch S and closed switch S may be further enlarged.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

As used herein, the term "electrically coupled" is not meant to mean that the elements must be directly coupled together but intervening elements may be provided between the "electrically coupled" elements.

As used herein, the term "active area" refers to a semiconductor area of a device that is electrically isolated from semiconductor areas of other areas by an isolation such as a trench isolation or junction isolation, for example.

As used herein, the term "dose of doping" of a specific conductivity type, e.g., n-type or p-type, refers to the number of dopants of that specific conductivity type introduced into a semiconductor body, e.g., drift zone, per unit surface area by an appropriate method, e.g., ion implantation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a cathode; and
   an anode including a first p-type semiconductor anode region and a second p-type semiconductor anode region, the first p-type semiconductor anode region being electrically connected to an anode contact area, the second p-type semiconductor anode region being electrically coupled to the anode contact area via a switch configured to provide an electrical connection or an electrical disconnection between the second p-type semiconductor anode region and the anode contact area.

2. The semiconductor device of claim 1, wherein a dose of n-type doping in a first portion of the cathode opposite the first p-type semiconductor anode region is smaller than the dose of n-type doping in a second portion of the cathode opposite the second p-type semiconductor anode region.

3. The semiconductor device of claim 2, wherein a ratio of the dose of the n-type doping in the second portion of the cathode to the dose of the n-type doping in the first portion of the cathode is between 5 to $10^4$.

4. The semiconductor device of claim 1, wherein a dose of p-type doping in the first p-type semiconductor anode region is smaller than the dose of p-type doping in the second p-type semiconductor anode region.

5. The semiconductor device of claim 4, wherein a ratio of the dose of the p-type doping in the second p-type semiconductor anode region to the dose of the p-type doping in the first p-type semiconductor anode region is between 5 to $10^4$.

6. The semiconductor device of claim 1, wherein a bottom side of the second p-type semiconductor anode is located deeper within a semiconductor substrate than a bottom side of the first p-type semiconductor region.

7. The semiconductor device of claim 1, further comprising:
   an n-type drift zone arranged between the first p-type semiconductor region and the second p-type semiconductor region and between the cathode and the anode.

8. The semiconductor device of claim 1, wherein the first p-type semiconductor anode region is part of a merged pin Schottky diode.

9. The semiconductor device of claim 1, wherein the switch includes a field effect transistor.

10. The semiconductor device of claim 9, wherein the second p-type semiconductor region is one of a source and a drain of the field effect transistor.

11. The semiconductor device of claim 10, wherein the switch is one of a planar field effect transistor including a lateral channel or a trench field effect transistor including a vertical channel.

12. The semiconductor device of claim 10, wherein the switch includes a first auxiliary n-type region and a second auxiliary p-type region, the second auxiliary p-type region being the other one of the source and the drain of the field effect transistor.

13. The semiconductor switch of claim 12, wherein the first auxiliary n-type region and the second auxiliary p-type region are electrically connected to the anode contact area.

14. The semiconductor device of claim 13, wherein:
   the switch is a planar field effect transistor including a lateral channel;
   the first auxiliary n-type region is arranged in the second p-type semiconductor anode region;
   the second auxiliary p-type region is arranged in the first auxiliary n-type region;

the second p-type semiconductor anode region, the first auxiliary n-type region and the second auxiliary p-type region each adjoin a surface of a semiconductor substrate; and a gate is arranged above the first auxiliary n-type region, the gate being configured to control a conductivity of a channel located in the first auxiliary n-type region at the surface between the second auxiliary p-type region and the second p-type semiconductor anode region.

15. The semiconductor device of claim 14, wherein an extension of the gate along a channel direction parallel to the surface between the source and the drain of the planar field effect transistor ends above the second p-type semiconductor anode region.

16. The semiconductor device of claim 14, wherein an extension of the gate along a channel direction parallel to the surface between the source and the drain of the planar field effect transistor ends above an n-type drift zone.

17. The semiconductor device of claim 1, wherein a blocking capability between the anode and the cathode is between 0.6 kV and 10 kV.

18. The semiconductor device of claim 13, wherein:
the switch is a trench field effect transistor including a vertical channel;
the first auxiliary n-type region is arranged in the second p-type semiconductor anode region;
the second auxiliary p-type region is arranged in the first auxiliary n-type region;
the first auxiliary n-type region and the second auxiliary p-type region adjoin a surface of a semiconductor substrate; and
a gate electrode is arranged within a trench, the gate electrode being configured to control the conductivity of a channel located in the first auxiliary n-type region at a sidewall of the trench between the second auxiliary p-type region and the second p-type semiconductor anode region.

19. The semiconductor device of claim 18, wherein a bottom side of the gate electrode ends deeper within the semiconductor substrate than a bottom side of the second p-type anode region.

20. The semiconductor device of claim 18, wherein a bottom side of the gate electrode within the semiconductor substrate ends at a same level with or above a bottom side of the second p-type anode region.

21. The semiconductor device of claim 1, wherein the first p-type semiconductor anode region adjoins a trench isolation.

22. The semiconductor device of claim 1, wherein minority carrier lifetime is higher in the second p-type semiconductor anode region than in the first p-type semiconductor anode region.

23. The semiconductor device of claim 22, wherein a ratio of the minority carrier lifetime in the second p-type semiconductor anode region to the minority carrier lifetime in first p-type semiconductor anode region is between 5 to $10^4$.

24. The semiconductor device of claim 1, wherein an efficiency of the second p-type semiconductor anode region is higher than an efficiency of the first p-type semiconductor anode region.

25. The semiconductor device of claim 24, wherein a ratio of the efficiency of second p-type semiconductor anode region to the efficiency of the first p-type semiconductor anode region is between 5 to $10^4$.

* * * * *